(12) United States Patent
Raja et al.

(10) Patent No.: US 7,022,564 B1
(45) Date of Patent: Apr. 4, 2006

(54) METHOD OF FORMING A LOW THERMAL RESISTANCE DEVICE AND STRUCTURE

(75) Inventors: Narayan Raja, Warwick, RI (US); Roger P. Stout, Chandler, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/964,021

(22) Filed: Oct. 14, 2004

(51) Int. Cl.
*H01L 21/336* (2006.01)

(52) U.S. Cl. .................................... 438/197

(58) Field of Classification Search ............... 438/197, 438/199, 206, 212, 229, 231, 232, 234, 262, 438/268, 299, 301, 305, 306, 309, 322, 325, 438/327, 335, 364, 369, 371–376, 542–549, 438/554–556, 914, 920, 922
See application file for complete search history.

(56) References Cited

U.S. PATENT DOCUMENTS

| | | | |
|---|---|---|---|
| 4,898,804 A * | 2/1990 | Rauschenbach et al. | 430/311 |
| 5,034,785 A | 7/1991 | Blanchard | |
| 6,043,532 A * | 3/2000 | Depetro et al. | 257/335 |
| 6,060,761 A * | 5/2000 | Kawakita et al. | 257/557 |
| 6,204,533 B1 | 3/2001 | Williams et al. | |
| 6,541,818 B1 | 4/2003 | Pfirsch et al. | |
| 6,566,710 B1 | 5/2003 | Strachan et al. | |
| 6,905,921 B1 * | 6/2005 | Liu et al. | 438/197 |
| 2001/0000627 A1 * | 5/2001 | Hayakawa et al. | 257/347 |
| 2003/0055613 A1 * | 3/2003 | Tsai | 703/2 |

* cited by examiner

*Primary Examiner*—Michael Lebentritt
*Assistant Examiner*—Andre' Stevenson
(74) *Attorney, Agent, or Firm*—Robert F. Hightower

(57) ABSTRACT

A semiconductor device is formed to have a shape that reduces the thermal resistance of the semiconductor device.

18 Claims, 4 Drawing Sheets

METHOD OF FORMING A LOW THERMAL RESISTANCE DEVICE AND STRUCTURE

This application is related to co-pending application Ser. No. 10/964,022 having a common assignee.

BACKGROUND OF THE INVENTION

The present invention relates, in general, to electronics, and more particularly, to methods of forming semiconductor devices and structure.

In the past, the semiconductor industry utilized various methods and structures to form semiconductor devices. Forming power devices usually presented a concern of the maximum power that could be dissipated by the semiconductor device. Typically, the power device was formed as a single fixed area of a semiconductor substrate. FIG. 1 schematically illustrates a general conception of a semiconductor device 200 that had a power device 202 on a semiconductor substrate 201. A top portion of FIG. 1 illustrates a plan view of device 200 while a bottom portion of FIG. 1 illustrates a cross-sectional view along section lines 1—1. Dashed lines illustrate heat that radiated from power device 202 through substrate 201. As can be seen, most of the heat was concentrated in a portion 204 of substrate 201. Portion 204 was referred to as a self-interacting region of heat. Such self-interacting regions of heat typically caused semiconductor device 200 to have a high thermal resistance and reduced the maximum power that device 200 could dissipate. In some cases, the high thermal resistance semiconductor devices required extra cooling to keep the temperature of the semiconductor die below a maximum allowable limit thereby increasing the cost of using the semiconductor device. Because of the high thermal resistance, the temperature of the semiconductor die often increased to a temperature which reduced the reliability and lifetime of the semiconductor device.

Accordingly, it is desirable to have a method that efficiently distributes heat within a semiconductor device, that does not reduce the packing density of the semiconductor device, and that lowers the thermal resistance of the semiconductor device.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
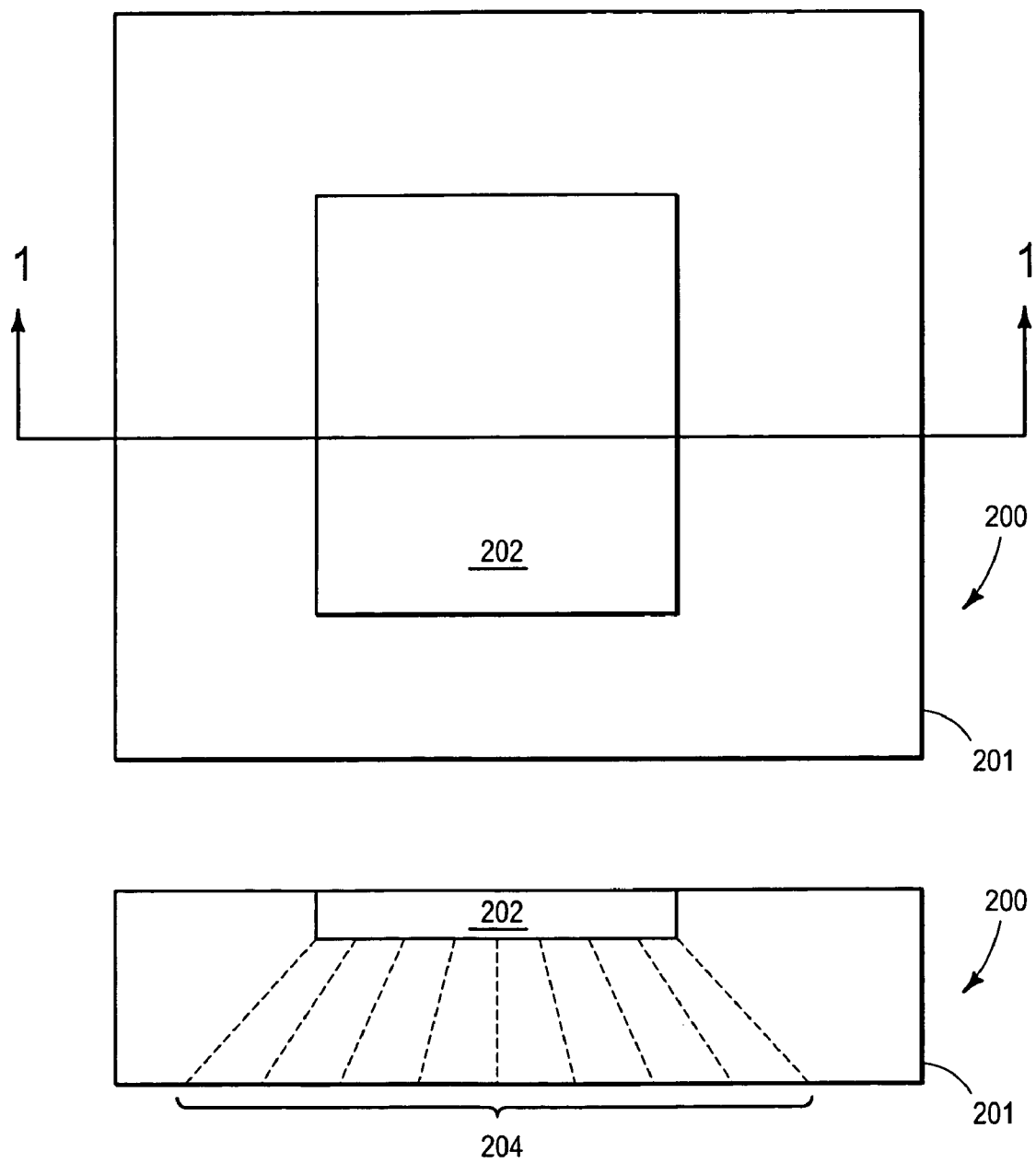
FIG. 1 schematically illustrates a prior art high thermal resistance semiconductor device.
Figure 2:
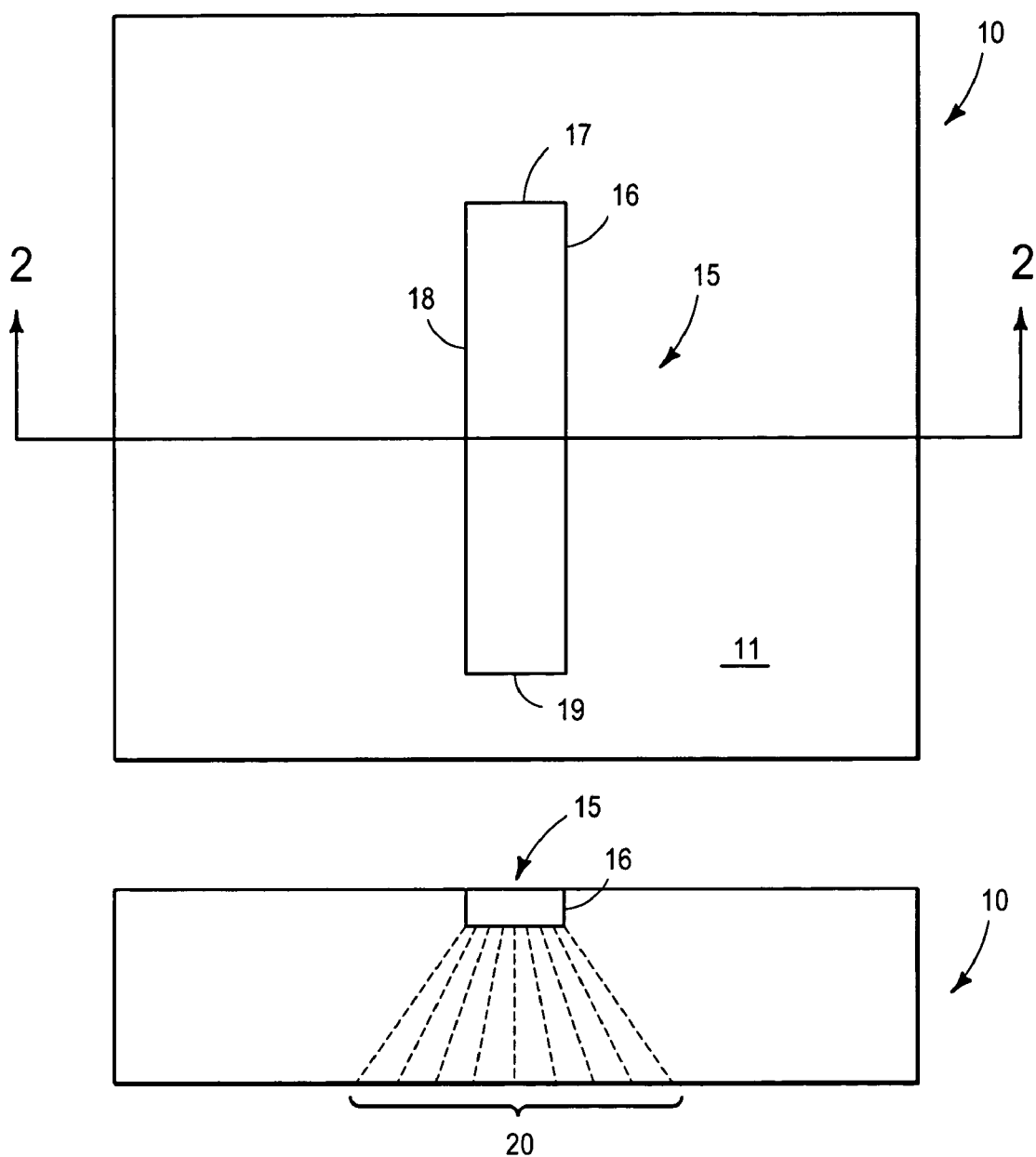
FIG. 2 schematically illustrates a portion of an embodiment of a semiconductor device in accordance with the present invention.

FIG. 2 schematically illustrates a portion of an embodiment of a semiconductor device 10 that is formed on a semiconductor substrate 11. A top portion of FIG. 2 illustrates a plan view of device 10 while a bottom portion of FIG. 2 illustrates a cross-sectional view along section lines 2—2. Device 10 includes a high power dissipating semiconductor device 15 that is formed to have a shape or topology that provides improved thermal distribution for device 10, that minimizes the value of the thermal resistance of device 10, and that maximizes the utilization of the area of semiconductor substrate 11. It has been found that a class of shapes or topologies of four-sided polygons that have a perimeter ratio that is between about 1.8 and 2.4 provides the improved thermal distribution. For example, the polygon may be any one of a rectangle, parallelogram, trapezoid, or rhombus or any other four sided polygon having the perimeter ratio. As used herein, the perimeter ratio of a shape is the ratio between the length of the perimeter of the shape and the length of the circumference of an equivalent circle having an area that is equal to the area of the shape. Another way of expressing the perimeter ratio is a shape with a perimeter length that is at least N times greater than the length of the circumference of an equivalent circle that has the same area as the area of the shape. For the class of four-sided polygons that have a perimeter ratio that is about 1.8 to 2.4, N is about 1.8 to 2.4. Device 15 is an example of such a shape.

Device 15 may be a vertical power metal oxide semiconductor (MOS) transistor, or a lateral MOS power transistor, or a high current diode, or a bipolar transistor. For example, device 15 may be a lateral or vertical LDMOS power transistor. Device 10 may also include other active or passive semiconductor elements that are not shown for simplicity of the drawings. As will be seen hereinafter, high power dissipating portions of device 15 are arranged to form the shape of device 15. Device 15 has long sides 16 and 18, and short sides 17 and 19 that are arranged to form a perimeter of the shape of device 15. For the case where device 15 is a non-cell-based bipolar transistor or a non-cell-based lateral MOS power transistor, sides 16–19 typically are formed by the exterior sides of doped regions of the current carrying electrodes of device 15 such as the exterior edge of a doped region within substrate 11 that forms the drain region. Typically, such doped regions extend to the surface of substrate 11 and have a shape on the surface. Sides 16–19 may also be formed as the exterior edges of the doped regions of substrate 11 that form the high power dissipating regions of device 15. For the example of a lateral MOS power transistor, during operation the high power dissipation typically occurs in the channel region between the drain and the source. Since the channel is defined as the region between the source and drain, the edge of the doped region forming the source and facing the drain is one side of the shape, such as side 16. Also, the edge of the doped region of the drain that faces the source can be another side of the shape, such as side 18. Thus, one side of the doped regions forming the drain or the source becomes a side of device 15. The cross-sectional view of device 10 shows that the structure forms device 10 into a region of high power dissipation. The portions of substrate 11 not underlying device 15 are lower power dissipation areas of substrate 11. Dashed lines illustrate the regions of high heat dissipation that radiates from the doped regions of device 15. Thus, forming device 15 in the shape of the four-sided polygon having a perimeter ratio that is about 1.8 to 2.4 distributes the heat out across a greater area of substrate 11, reduces the size of the self-interacting region, and reduces the heat that has to be dissipated at any point of substrate 11 underlying device 15 thereby lowering the thermal resistance of device 10.

In one example embodiment, a device 15 has sides 16 and 18 of about one unit and sides 17 and 19 of about 8.1 units. The resulting perimeter is about 18.2 units and the area is about 8.1 units. The equivalent circle of the same area has a circumference of about 10.09 units. Thus the perimeter ratio of the exemplary device 15 is about 1.804 (18.2 divided by 10.09). Forming device 15 with a perimeter ratio of between 1.8 to 2.4 provides an unexpected result of reduced thermal resistance. Prior art devices typically were considered more efficient when the shape was very close to that of a square or a circle. Prior devices did not have a perimeter ratio that was within the range of 1.8 to 2.4. Thus this range of perimeter ratios provides the unexpected thermal resistance reduction.

Figure 3:
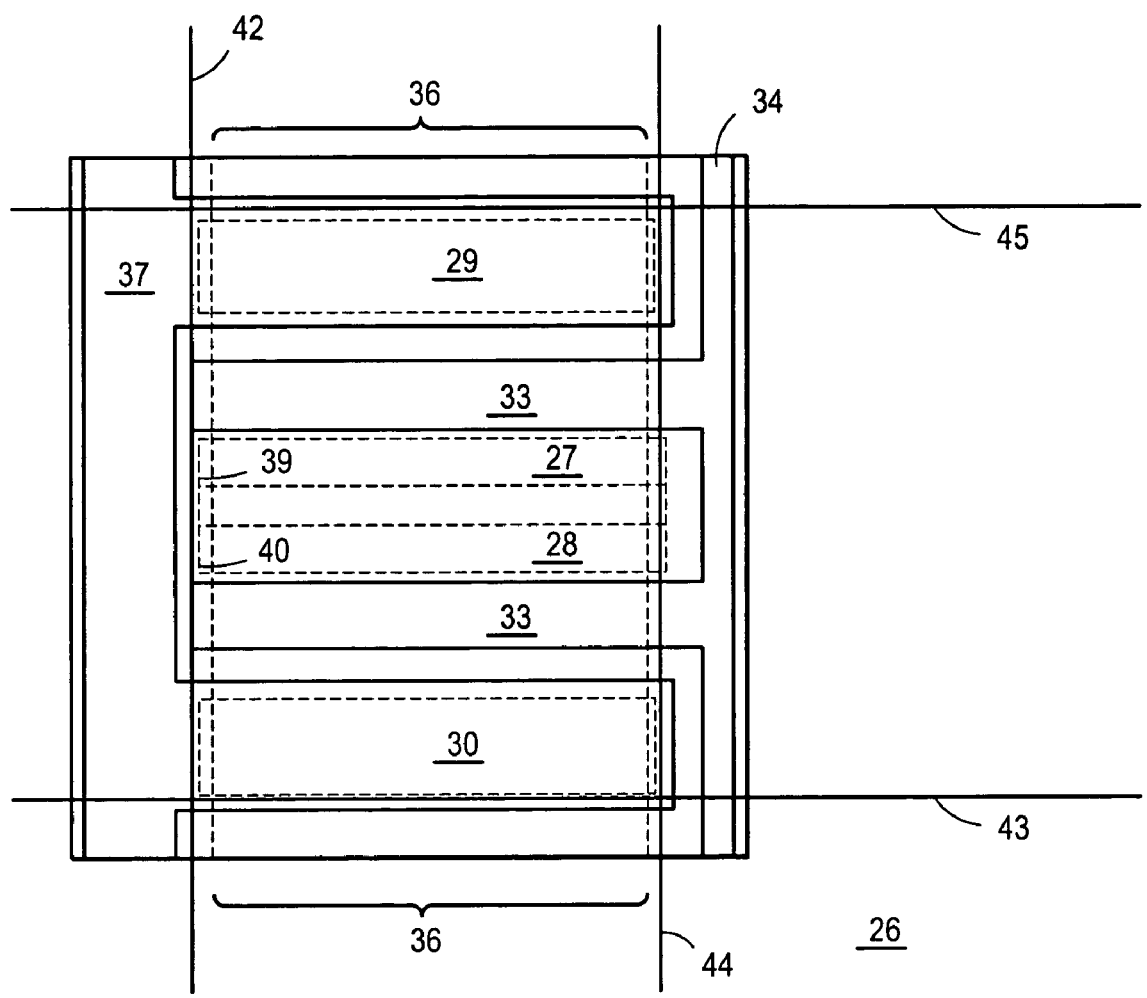
FIG. 3 schematically illustrates a plan view of a portion of an embodiment of a cell of a cell-based semiconductor device in accordance with the present invention.

FIG. 3 schematically illustrates a portion of an embodiment of a transistor cell 26 that is used to form a cell-based lateral MOS power transistor. Transistor cells such as cell 26 typically include a first doped region 30 and a second doped region 29 that are formed on a semiconductor substrate and function as a drain region of transistor cell 26. Additionally, a third doped region 27 and a fourth doped region 28 are formed on the semiconductor substrate and function as sources of cell 26. Regions 27, 28, 29, and 30 are illustrated by dashed lines since they are generally covered by conductors 36 and 37. Gates 33 typically are formed on the surface of the substrate and between regions 27 and 29 and between regions 28 and 30. A gate conductor 34 makes electrical contact to gates 33 and facilitates electrically connecting cell 26 to other adjacent transistor cells that may be formed in a cell-based transistor. Similarly, a drain conductor 37 facilitates electrically connecting regions 29 and 30 together to similar drains in an adjacent transistor cell. A source conductor 36, illustrated by dashed lines, typically extends across cell 26 and makes electrical contact to regions 27 and 28 and facilitates electrically connecting regions 27 and 28 to other similar sources in adjacent transistor cells.

Cell 26 has four sides illustrated as lines 42, 43, 44, and 45. Line 42 is a line that extends along an edge of doped regions 27 and 28 that form the sources and doped regions 29 and 30 that form the drains. Line 42 represents one side of the doped regions within the semiconductor substrate on which cell 26 is formed. Similarly, line 44 extends along an opposite side of regions 27 and 28 and corresponding regions 29 and 30 in a manner similar to line 42. Lines 42 and 44 just barely touch the outermost or distal edges of the doped regions. Line 43 extends along an outside edge of region 30 and forms another side of cell 26. Similarly, line 45 extends along an outside edge of region 29. Lines 42–45 are extended past the boundaries of cell 26 to aid in identifying lines 42–45. For a vertical cell, lines 43 and 45 typically would extend along and just barely touch the outside edge of gates 33. At the least, lines 43 and 45 extend along the portion of cell 26 that dissipates the most power during the operation of cell 26, such as along the channel that is overlying the portion of the drain where the largest current flow occurs.

Transistor cells and corresponding cell-based transistors are well known to those skilled in the art. Examples of transistor cells and corresponding cell-based transistors are disclosed in U.S. Pat. No. 6,566,710 issued to Strachan et al on May 20, 2003, U.S. Pat. No. 6,541,818 issued to Pfirsch on Apr. 1, 2003, U.S. Pat. No. 6,204,533 issued to Williams et al on Mar. 20, 2001, and U.S. Pat. No. 5,034,785 issued to Richard Blanchard on Jul. 23, 1991 which are hereby incorporated herein by reference.

For MOS transistors, the high power dissipation is primarily in the channel region. The channel region typically is the region between the source and drain. Typically, an edge of the source that faces the drain is one edge of the channel and the edge of the drain that faces the source is another edge of the channel. The channel width is at least the width of the narrowest of the edge of the source or drain that faces the channel. Consequently the outside and inside edges of the source or drain can be used to form sides of the cell, thus, sides of the shape that uses the cell. In most cases, this method of finding the sides of the shape is more reliable than using the metal conductors that interconnect the cells together. However, the metal may be used in some cell embodiments. For some closed lateral cells, one edge of the cell may be considered as a line through a source region that is common to two adjacent cells. A typical example of such a cell embodiment is disclosed in U.S. Pat. No. 6,566,710 issued to Strachan et al on May 20 2003. In other embodiments, cells may be utilized to form a vertical transistor cell that is used in forming vertical cell-based MOS power transistors. For such vertical transistor cells, the drain of regions 29 and 30 typically underlie portions of the sources of respective regions 27 and 28 and also underlie portions of gates 33. Consequently the outside edge of the gate can be used to form the side of the cell, thus, the side of the shape that uses the cell. For some closed vertical cells, the cell may be oriented so that the outside edge of the cell is a point instead of a straight line. A typical example of such a cell embodiment is disclosed in U.S. Pat. No. 6,541,818 issued to Pfirsch on Apr. 1, 2003. For such cells, a line may be drawn to touch the distal points of each outermost cell to form the outside edge of the shape that uses the cell and a similar line may be drawn to connect the distal edge of the innermost cells to form the inside boundary of the shape that uses the cell as will be seen further hereinafter.

As will be understood by those skilled in the art, many various cell implementations are used in the art and many variations are expected in the future as cell designs are modified to provide improved operating parameters such as on-resistance, capacitance, etc. Thus the examples described herein, including the example of cell 26, explaining where the cell boundaries may be defined can vary based on exactly how the cell, thus the shape of the device that uses the cell, is implemented.

Figure 4:
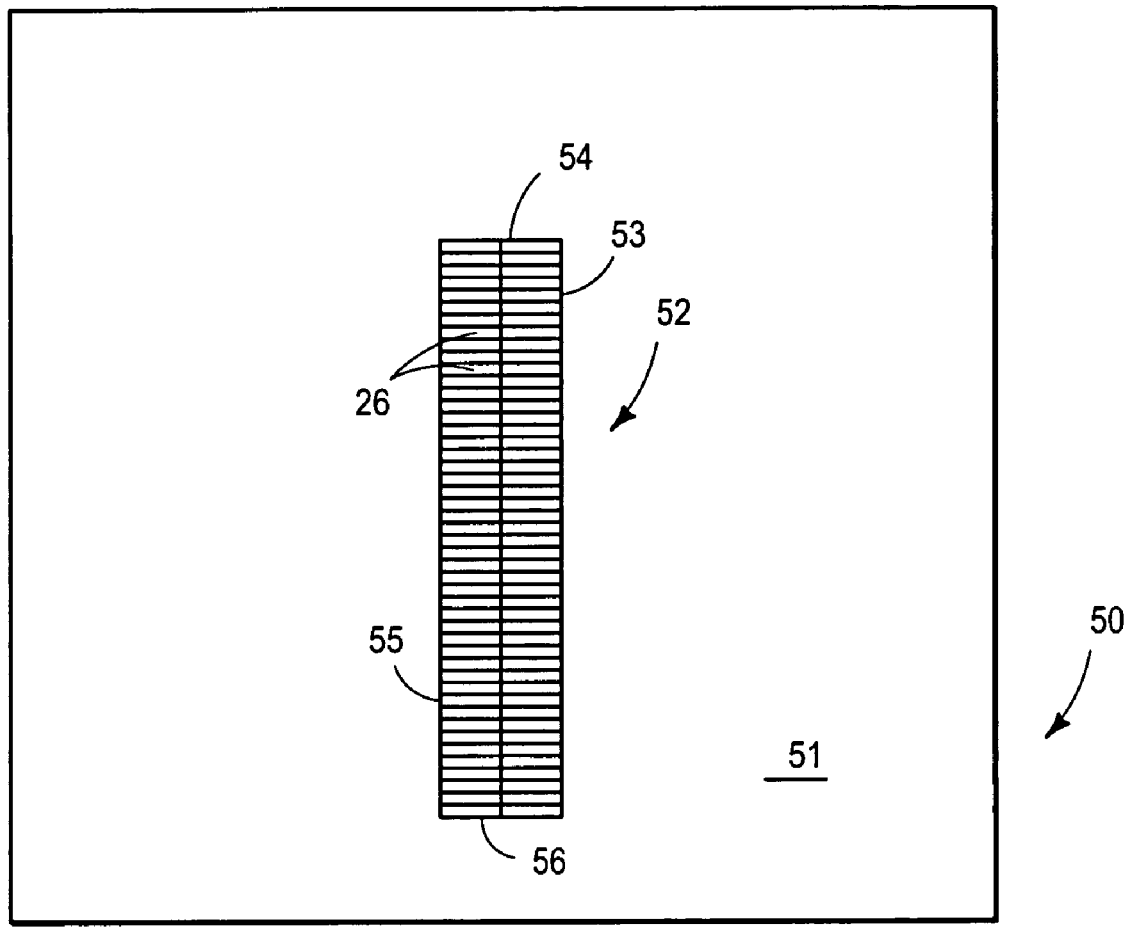
FIG. 4 schematically illustrates a plan view of a portion of an embodiment of another semiconductor device in accordance with the present invention.

FIG. 4 schematically illustrates a plan view of a portion of an embodiment of a semiconductor device 50 that is formed on a semiconductor substrate 51. Device 50 includes a high power dissipating cell-based semiconductor device 52 that is formed from cells such as transistor cell 26 explained in the description of FIG. 3. Devices 50 and 52 are alternate embodiments of devices 10 and 15 explained in the description of FIG. 2. The shape of device 52 provides device 50 improved thermal distribution, minimizes the value of the thermal resistance of device 50, and maximizes the utilization of the area of semiconductor substrate 51. Device 52 can be a variety of cell-based semiconductor devices including a vertical MOS power transistor, or a lateral MOS power transistor, or a high current diode or a bipolar transistor. For example, device 52 may be a lateral or vertical LDMOS power transistor. Device 50 may also include other active or passive semiconductor elements that are not shown in FIG. 4 for simplicity of the drawings.

For the example embodiment illustrated in FIG. 4, device 52 is a lateral LDMOS transistor. Such an embodiment of device 52 includes a plurality of cells, such as cell 26, that are positioned on substrate 51 in a shape similar to the shape of device 15 that was explained in the description of FIG. 2. Device 52 has a perimeter that includes a first side 53, a second side 54, a third side 55, and a fourth side 56. Side 53 is formed by an outside edge of the doped regions of the current carrying electrodes of the cells along the perimeter of device 52 next to side 56. These doped regions typically form the high power dissipating regions of each cell 26. For the example of a lateral MOS power transistor using cell 26 explained in the description of FIG. 3, during operation the high power dissipation occurs in the channel regions as explained hereinbefore in the description of FIG. 3. Thus, for this example the distal edge of the doped region forming the drain or the source of the outermost right-hand cell becomes outside edge or side 53. Correspondingly, the distal edge of the doped region forming the drain or the source of the left-hand outermost cell becomes edge or side 55.

Device 52 is formed by coupling together the plurality of cells to function substantially in unison to form the functionality for device 52. Side 53 of device 52 could be formed by any of lines 42, 43, 44, or 45 of cells 26 depending on how the cells are positioned within device 52. Similarly sides 54, 55, and 56 of the perimeter of device 52 are also formed by one of lines 42–45 depending on the position of the cells used to form device 52. Sides 53–56 of device 52 are arranged to form a perimeter of the shape of device 52. Forming device 52 in the shape of the four sided figure spreads the heat generated by device 52 out across substrate 51, reduces the size of the self-interacting region, and reduces the heat that has to be dissipated at any point of substrate 51 underlying device 52 thereby lowering the thermal resistance of device 50.

In view of all of the above, it is evident that a novel device and method is disclosed. Included, among other features, is forming a devices to have a shape or topology that provide improved thermal distribution and a reduced thermal resistance. The topology of a rectangle having a perimeter ratio of 1.8 to 2.4 provides the improved thermal resistance.

While the invention is described with specific preferred embodiments, it is evident that many alternatives and variations will be apparent to those skilled in the semiconductor arts.

The invention claimed is:

1. A method of forming a semiconductor device comprising:
   forming doped regions of the semiconductor device in a device shape having a first perimeter that has a first length on a surface of a semiconductor substrate and having a first area; and
   arranging the doped regions to form the device shape that is a four sided polygon wherein the first length is approximately 1.8 to 2.4 times a first distance around a circumference of a circle having the first area.

2. The method of claim 1 wherein forming doped regions of the semiconductor device in the device shape having the first perimeter that has the first length on the surface of the semiconductor substrate and having the first area includes coupling together a plurality of cells to function substantially in unison to form a functionality for the semiconductor device.

3. The method of claim 2 wherein coupling together the plurality of cells to function substantially in unison includes coupling together the plurality of cells to function substantially in unison wherein a line connecting an outer side of doped regions of the plurality of cells forms the device shape.

4. The method of claim 2 wherein coupling together the plurality of cells to function substantially in unison to form the functionality for the semiconductor device includes coupling together the plurality of cells wherein each cell has a first current carrying electrode and a second current carrying electrode wherein all first current carrying electrodes are commonly connected together and all second current carrying electrodes are commonly connected together.

5. The method of claim 2 further including each cell having a control electrode wherein all control electrodes are commonly connected together.

6. The method of claim 1 wherein forming doped regions of the semiconductor device in the device shape having the first perimeter that has the first length on the surface of the semiconductor substrate and having the first area includes coupling together a plurality of cells wherein a line intersecting a distal edge of doped regions of a current carrying electrode of the plurality cells forms at least one side of the first perimeter.

7. The method of claim 1 wherein arranging the doped regions to form the device shape includes arranging the doped regions to form the device shape as one of a rectangle, parallelogram, trapezoid, or rhombus.

8. The method of claim 1 wherein forming the doped regions of the semiconductor device includes forming the doped regions of one of a lateral power transistor or a vertical power transistor.

9. The method of claim 1 wherein arranging the doped regions includes arranging a source region or a drain region wherein one side of the source region or the drain region forms a side of the first perimeter.

10. A method of improving the thermal dissipation of a semiconductor device comprising:
    arranging doped regions of the semiconductor device to form a device shape having a first perimeter having a first length and a first area wherein the device shape is a four sided polygon wherein the first length is about 1.8 to 2.4 times a first distance around a circumference of a circle having the first area.

11. The method of claim 10 wherein arranging the doped regions includes arranging a plurality of device cells to form the device shape.

12. The method of claim 10 wherein arranging the doped regions includes arranging the doped regions of the semiconductor device to form the device shape that is one of a rectangle, parallelogram, trapezoid, or rhombus.

13. A semiconductor device comprising:
    a device shape having a first perimeter having a first length and a first area wherein the device shape is a four sided polygon wherein the first length is about 1.8 to 2.4 times a first distance around a circumference of a circle having the first area.

14. The semiconductor device of claim 13 wherein the device shape includes a plurality of cells operably coupled to function substantially in unison to form a functionality for the semiconductor device.

15. The semiconductor device of claim 14 wherein outer sides of doped regions of the plurality of cells form the device shape.

16. The semiconductor device of claim 13 further including a line intersecting a distal edge of doped regions of a current carrying electrode of the semiconductor device forming at least one side of the first perimeter.

17. The semiconductor device of claim 13 wherein the semiconductor device is one of a lateral transistor or a vertical transistor.

18. The semiconductor device of claim 13 wherein the device shape is one of a rectangle, parallelogram, trapezoid, or rhombus.

* * * * *